(12) United States Patent
Tan et al.

(10) Patent No.: US 6,211,742 B1
(45) Date of Patent: Apr. 3, 2001

(54) LOCK DETECTOR FOR PHASE LOCKED LOOPS

(75) Inventors: Loke Kun Tan, Laguna Niguel; Farzad Etemadi, Irvine; Denny Yuen; Shauhyarn Shaun Tsai, both of Torrance, all of CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/433,811

(22) Filed: Nov. 3, 1999

Related U.S. Application Data

(60) Provisional application No. 60/107,104, filed on Nov. 4, 1998.

(51) Int. Cl.$^7$ .................................................. H03L 7/095
(52) U.S. Cl. ........................................ 331/25; 331/DIG. 2
(58) Field of Search .............................. 331/25, DIG. 2; 327/7, 40

(56) References Cited

U.S. PATENT DOCUMENTS

| | | | |
|---|---|---|---|
| 5,294,894 | 3/1994 | Gebara | 331/1 A |
| 5,530,383 * | 6/1996 | May | 331/DIG. 2 |

FOREIGN PATENT DOCUMENTS

| | | |
|---|---|---|
| 0 012 899 A1 | 7/1980 | (EP) . |
| 0 332 467 A2 | 9/1989 | (EP) . |
| 0 673 121 A2 | 9/1995 | (EP) . |
| 2 268 645 | 1/1994 | (GB) . |

* cited by examiner

*Primary Examiner*—Siegfried H. Grimm
(74) *Attorney, Agent, or Firm*—Christie, Parker & Hale, LLP

(57) ABSTRACT

A detector circuit for determining whether synchronization lock has been optimally achieved in feedback-type control systems. The detector circuit evaluates an error signal developed by a phase/frequency detector and compares the absolute magnitude of the error signal to a first threshold signal corresponding to a magnitude metric. When the value of the error signal is less than the magnitude threshold value, an event signal initiates a time interval counter which continues counting so long as the error signal remains below the magnitude threshold value. The time interval counter continues until it counts to a second threshold value corresponding to a timing metric. At this point, synchronization lock is declared.

10 Claims, 3 Drawing Sheets

LOCK DETECTOR FOR PHASE LOCKED LOOPS

CROSS-REFERENCE TO RELATED APPLICATION(S)

This patent application is related to and claims the priority date of provisional Application No. 60/107,104, filed Nov. 4, 1998, the entire contents of which is hereby expressly incorporated by reference.

FIELD OF THE INVENTION

The present invention relates generally to lock detectors for phase lock loops and, more particularly, to a lock detector which establishes upper and lower bounds to a lock range in order to ensure that phase error is substantially confined within the range before acquisition of lock is declared.

BACKGROUND OF THE INVENTION

Phase lock loops (PLLs) and clock recovery circuits (CRCs) have found wide application in such diverse areas as digital communication systems, wireless systems, digital circuits and data recovery systems for use in connection with mass storage media such as hard disk, tape and optical drives. In the field of digital communication systems, phase lock loops are typically used in modern digital communications receivers to recover useful data from a transmission signal stream by providing data recovery circuitry with a timing reference having the appropriate frequency and phase characteristics so as to match timing characteristics of the transmitted signal and thus, ensure proper data recovery.

In modern HDTV signal transmissions, a receiver must be capable of locking onto a transmitter's pilot carrier phase as well as the transmitter's timing phase. Locking the receiver to the transmitter's carrier phase is commonly referred to as carrier phase recovery, whereas locking onto the timing phase of the transmitter is referred to as timing phase recovery. Both of these functions are critical to a modern day communications system since the receiver must be synchronized to the transmitter in order that transmitted data may be correctly demodulated, and equalized.

Applications of phase lock loops (or more correctly frequency-phase locked loops, FPLLS) in a modern high-speed communications system would include their use as frequency acquisition tools in a receiver's channel tuner and as an automatic gain control (AGC) loop, disposed within a channel tuner, which ensures that the power level of a received signal is suitably limited to a particular desired level. Thus, it can be seen that PLLs and FPLLs play a significant role in the effective operation of various portions of a modern digital communication system. Indeed, it is difficult to conceive of a modern high-speed digital communications system that does not make extensive use of precision PLLS.

Notwithstanding the necessity of their use in modern communication systems, conventional PLLs suffer from a particular disadvantage that makes their use in modern, high-speed communication systems problematic. This disadvantage relates most particularly to the time characteristics of the phase error response of a first order or second order PLL in response to a prompt change in the phase of an input signal. Given the extremely precise phase and timing alignments required in modern high-speed communication systems, and their correspondingly small phase error margins, a false designation of phase lock during a phase acquisition procedure can very easily result in the loss of system timing and a consequent disruption of, for example, carrier recovery operations and thus, a loss of signal.

SUMMARY OF THE INVENTION

The present invention is directed to a system and method for evaluating phase detector output so as to optimally determine when phase lock has been achieved. The novel lock detection system is suitable for incorporation in a phase locked loop of the type including a phase detector configured to develop phase error signals for use by, for example, a loop filter in deriving control signals for an oscillator circuit. A lock detector circuit evaluates phase error signals in order to determine whether a locked condition has been achieved on the basis of the output signal train of phase detector's passing evaluation against a magnitude metric and a timing metric.

In one aspect of the invention, the lock detector circuit includes a summing circuit having at least one input for receiving phase error signals developed by the phase detector. The summing circuit combines the absolute value of an input phase error signal with a negative valued first limit signal which corresponds to the maximum allowable phase error during lock. Summation of the two signals gives rise to a negative-valued signal when the phase error signal is below the first limit and a positive-valued signal when the absolute magnitude of the input phase error signal is above the first limit.

The output of the summing circuit is compared to a zero reference signal and outputs in a first state when the summation result is less than zero and outputs a signal in a second state when the summation result is greater than zero. A summation result less than zero indicates that the absolute magnitude of an input phase error signal is less than the first limit signal and therefore converging toward zero.

In a further aspect of the invention, the comparison circuit signal in a first state initiates a time interval counter. The time interval counter is reset at any time the absolute magnitude of any phase error signal exceeds the first limit signal, i.e., at any time the summation result is greater than or equal to zero. Lock is declared after the time interval counter counts to the end of a specified time interval. Thus, phase error signals must not only converge to a value less than the first limit signal but also remain at a value below the first limit signal for a period of time equal to the time interval counter's specified time interval.

In an additional aspect of the invention, a low pass filter is coupled between the lock detector and the phase detector circuit. The low pass filter averages phase error component values to remove extraneous high frequency noise and improve system performance. The output of the low pass filter is coupled to a conditioning circuit, such as a rectification circuit, which receives input phase error signals corresponding to both positive and negative phase relationships and conditions the phase error signal such that the output of the conditioning circuit represents their absolute magnitude.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE INVENTION

Figure 1A:
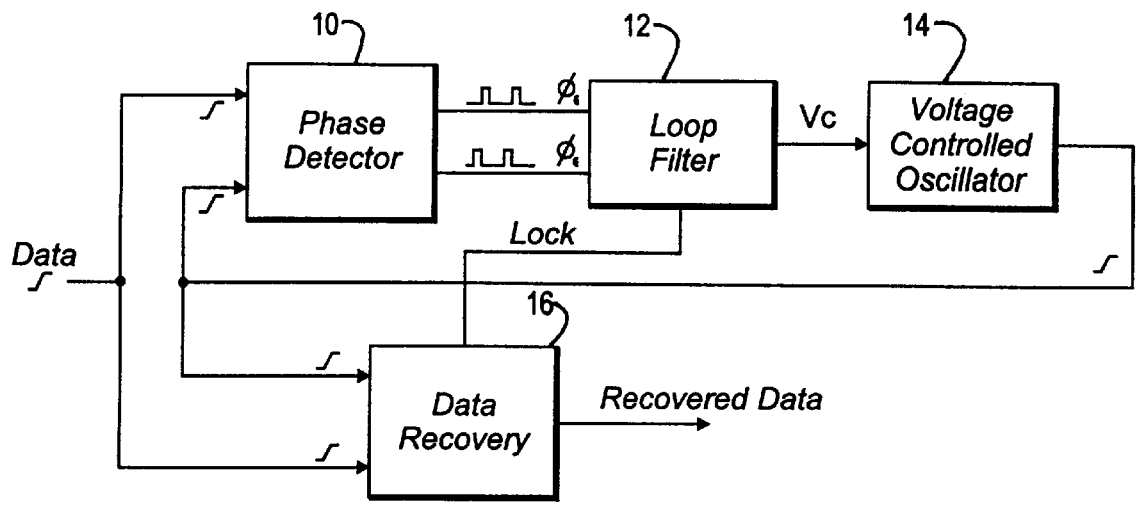
FIG. 1(*a*) is a semi-schematic block level diagram of a conventional phase lock loop (PLL) system used for data recovery, according to the prior art.
FIG. 1(b) is a waveform diagram illustrating the frequency and phase error response of the PLL of FIG. 1(a) to an input frequency step.

Conceptually, a conventional phase lock loop (PLL), such as depicted in semi-schematic block diagram form in FIG. 1(a), is a feedback system that operates on the excess phase of nominally periodic signals. Implementation of such a PLL normally comprises a phase detector (PD) or phase and frequency detector (PFD) 10 whose output is coupled to a loop filter (low-pass filter or LPF) 12 which, in turn, drives some means for generating a synchronous clock signal 14, such as a voltage controlled oscillator (VCO), current controlled oscillator (CCO) or decision controlled oscillator (DCO). When receiving data, during what is conventionally termed frequency or velocity lock, the oscillation frequency of the clock signal generator (termed a VCO for convenience) is determined by, and locked to the frequency of an external periodic signal source provided for such purpose (not shown), just prior to receiving an input datastream. Once frequency or velocity lock is established, the VCO runs in what might be termed a quasi-flywheel mode at a mean frequency determined during velocity lock.

Subsequent correction control to the VCO frequency is developed by phase-locking a transition edge of the synchronous VCO signal to a transition edge of an incoming data signal. The VCO is phase-locked to the incoming serial data stream by comparing the phase of the rising edge of the VCO clock signal FIG. 1 to the phase of the rising edge of data in the phase detector 10. A phase or time difference detected between the two rising edges causes the phase detector to issue a signal proportional to the phase difference which directs the VCO to either speed-up or slow-down in response to phase variations in the datastream.

Conventionally, the phase detector incorporates logic circuitry (in effect a logical NOR function) which precludes an output signal from being issued during phase comparisons unless two phase edges are present during a particular comparison cycle. This features prevents the PLL from becoming unstable by trying to perform a phase comparison between a VCO rising edge and a, for example, data ZERO bit (a data signal necessarily without a rising edge).

The loop filter 12 averages the phase-lead and/or phase-lag pulses from the phase detector 10, to define a control voltage which is applied to the input of the VCO 14 and further functions as a low-pass filter in order to minimize the effects of random component generated noise and certain forms of high frequency jitter. It is common practice to low-pass filter the difference component of a pair of PD sample signals to reduce the effect of random noise on the system.

Once phase lock is established, the output of the VCO 14 defines a timing signal which is provided as a clock input to a data recovery circuit, or decision circuit, 16. The overall effect is to define a standardized, unipolar timing signal coincident with every transition of the input data, such that the data recovery circuit or decision circuit 16 is able to provide properly regenerated data.

In such a system as depicted in FIG. 1(a), data recovery operations are necessarily precluded until such time as the PLL has achieved an adequate phase lock within the phase error budget of the overall system. Acquisition of lock is typically determined by a control logic block incorporating lock detection circuitry which might be disposed between the phase detector 10 and loop filter 12, in parallel with the filter or, might be disposed within the loop filter itself. Lock detectors conventionally operate by evaluating the phase detector output pulse width (or pulse duration) which is in turn, proportional to the phase error between an incoming signal and the VCO pulse train. Lock is declared by comparing the phase detector output pulse width to a pre-established threshold level which is commonly defined by the upper bound of the allowable phase error of the system. When the pulse detector output pulse width meets or falls below the phase error threshold, the system is deemed to have acquired lock and a lock signal is commonly asserted to the data recovery circuit 16, thereby enabling data recovery operations to proceed.

Figure 1B:
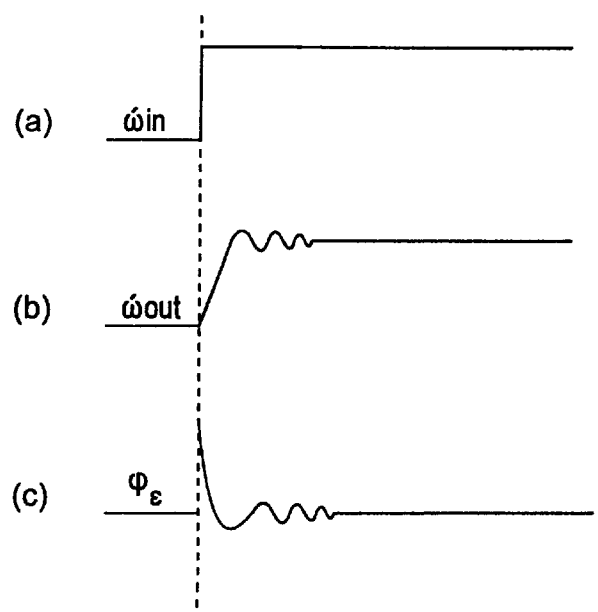

As shown in FIG. 1(b), when a PLL obtains lock following a change in the input frequency $\omega_{in}$, the phase error $\phi_e$ typically converges to a limit value, in most cases having a mean limit value of zero, as the frequency $\omega_{out}$ of the VCO 14 converges to the input value. In these particular circumstances, phase error is often observed to dither about the mean zero value. In certain other cases, a PLL is able to attain lock, but the phase error exhibits a small non-zero mean value. This particular circumstance occurs whenever the phase of the input signal exhibits a rapid change. The cause of these phenomena will become apparent when it is recognized that a first order PLL is defined as being capable of achieving phase lock with zero phase error to a given step change in the phase of the input signal. This same first order PLL is capable of achieving phase lock with a non-zero phase error to a linear ramp in the phase of an input signal. Similarly, a second order PLL is typically understood as being capable of achieving phase lock with zero phase error to either a step or a ramp in the phase of an input signal, while the same second order PLL is capable of achieving phase lock with a non-zero phase error to a parabolic phase change of the input signal.

A time domain plot of frequency response and phase error with respect to time in response to a prompt input frequency change is depicted in the waveform diagram of FIG. 1(b). It will be understood, by those with skill in the art, that some degree of frequency response lag and system damping related ringing characteristics are exhibited by all non-ideal control systems in response to prompt input perturbations. Accordingly, some degree of phase error will necessarily attend such prompt input changes.

Figure 2:
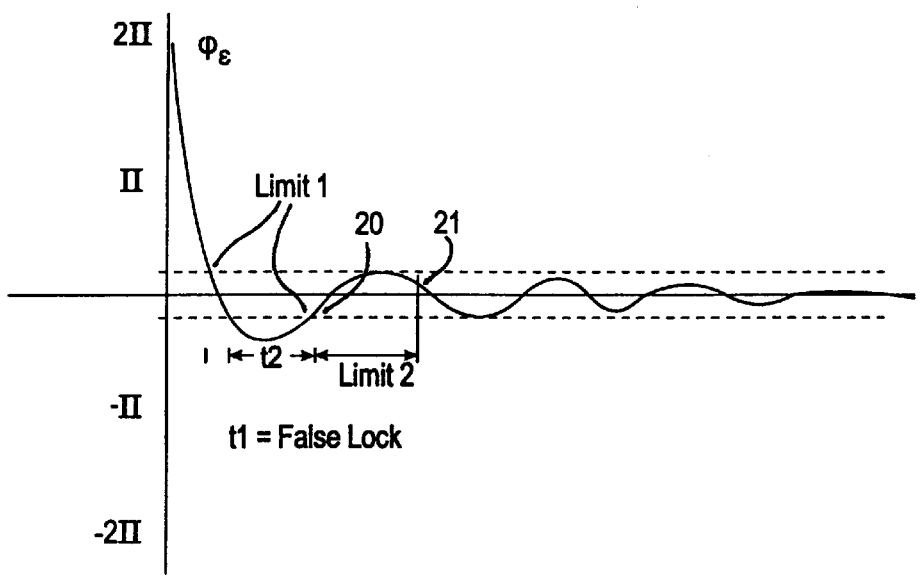
FIG. 2 is a waveform diagram illustrating the time response of PLL phase error to a phase step, including the extent of ambiguous lock regions as a function of phase error margin reduction, and indicating the lock acquisition to lock declaration timing window in accordance with practice of principles of the invention.

FIG. 2 is a waveform diagram illustrating a time plot of phase error associated with a prompt input change, such as might result from a frequency step. In the diagram, phase error in radians is plotted as a function of time immediately following a prompt phase change at the phase detector input. For purposes of convenience, only the positive portion of the phase plane is depicted in FIG. 2. It will be understood that a mirror image phase response (corresponding to a phase lag) is also susceptible of illustration but with opposite signs. As illustrated in the figure, the PLL achieves lock whenever the phase error converges below a certain pre-determined absolute limit, denoted in FIG. 2 as "limit 1". As is also clear from FIG. 2, if the phase error margin, as defined by "limit 1", is made particularly small, it is quite possible for the phase error to fall below the lock limit for a brief period of time, and then exceed the lock limit, in the opposite direction, for a substantial time duration before the system settles and the phase error converges closer to the zero limit. Accordingly, it will be understood that simply evaluating phase error against a particular limit value is an insufficient condition to initiate lock declaration and begin data recovery operations since this could very easily result in a false lock condition when the phase error response characteristic exceeds the desired limit in the opposite direction.

It is, therefore, necessary to introduce a second limit condition, denoted "limit 2" herein which defines a time interval within which the phase error response characteristic must remain within the pre-determined "limit 1", in order to achieve lock.

As can be seen from inspection of FIG. 2, phase lock, within the error margin, is actually achieved at the point where the phase error response characteristic reenters the "limit 1" boundary and remains within the boundary, although oscillating periodically about the zero radians point. This "lock achieved" position is indicated in the diagram of FIG. 2 at 20 and represents the third crossing of the "limit 1" boundary by the phase error response characteristic. It will be seen that the phase response characteristic passes through the "limit 1" boundaries during a first time interval $t_1$ which is of generally short duration. The phase error response characteristic then passes outside the "limit 1" boundary, falls to its maximum lag value and again approaches and crosses the "limit 1" boundary during a second time interval $t_2$, following which it remains within the "limit 1" boundaries for the remainder of the time interval of interest. In accordance with the present invention, the indication of "lock achieved" is therefore delayed until a period of time, exceeding "limit 2", has passed during which period of time the signal remains within "limit 1", as shown in FIG. 2 at 21. At this time, lock may be declared.

State trajectories and transient response characteristics of phase lock loops may be determined by simulation, once the design parameters of a particular PLL have been established. Accordingly, a phase error response plot, such as illustrated in FIG. 2, can be developed for various PLL types, as well as other phase response dependent control systems, from which appropriate "limit 2" time periods may be extracted by numerical or graphical interpretation. In the example of FIG. 2, an appropriate "limit 2" time period would be a time interval that necessarily exceeded $t_1$ in order to ensure that the false lock position depicted therein does not trigger a lock achieved condition. Rather, as depicted in FIG. 2, a significantly longer "limit 2" duration would ensure that the phase error response characteristic remained within the "limit 1" boundaries prior to lock being declared and data recovery operations commenced.

Figure 3:
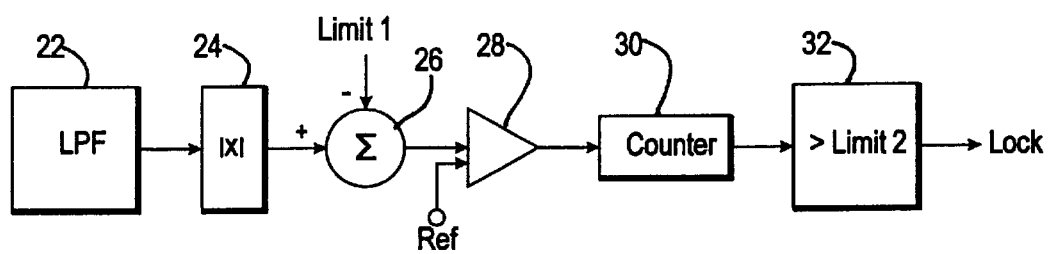
FIG. 3 is a semi-schematic simplified block diagram of a lock detector for optimally detecting a true lock condition in accordance with the present invention.

A particular, exemplary hardware implementation of such a novel lock detector is illustrated in semi-schematic simplified block diagram form in FIG. 3. Phase error signals, developed by a phase detector are received at the input of a low-pass filter 22 which performs the same high frequency noise reduction function as the loop filter (12 of FIG. 1) of a conventional PLL. The low pass filter 22 averages the phase error received at the input and provides the averaged error signal to a signal conditioning or shaping circuit, such as a digital rectification circuit 24, which functions, in the illustrated embodiment, to redefine the average phase error in terms of its absolute value. In other words, phase-lag error is converted into phase-lead error terms in order that the phase error terms have the appropriate sign for subsequent subtractive combination with a user pre-defined, non-zero DC "limit 1" value in an arithmetic computation circuit, such as a summing amplifier 26.

Once the absolute value of the phase error has been subtractively summed with the "limit 1" value, the resulting signal is processed by a comparator circuit 28 which compares the residual magnitude to a suitable reference value, such as zero, in order to determine if the phase error magnitude exceeds "limit 1" or is within the "limit 1" boundaries, i.e., the absolute magnitude of the phase error is greater than or less than the absolute magnitude of the "limit 1" value. Depending on the comparison results, if the absolute phase error magnitude is below "limit 1" the comparator circuit 28 may initiate a timing circuit, such as an interval counter 30, which begins to count-up as soon as the phase error magnitude falls below "limit 1". The output of the interval counter 30 is compared to a user defined time interval limit, "limit 2" in comparison logic 32 and when the interval counter value reaches the "limit 2" value, the system is deemed to have acquired lock and "lock" is declared to a data recovery circuit, for example.

In the event that the phase error magnitude falls within the "limit 1" boundary and then subsequently exceeds the "limit 1" threshold, the comparator 28 deasserts the interval counter and resets the interval counter to zero in anticipation of the phase error's again passing through the "limit 1" boundary.

A novel lock detector, such as described in connection with the illustrated embodiment of FIG. 3, may be easily incorporated into a phase lock loop of the type suitable for carrier recovery operations in a high-speed digital communication system. With amplitude modulation transmission schemes, the phase shift imposed by the modulating signal is relatively constant and a simplified PLL such as depicted in FIG. 1, might be used to detect the phase difference between the recovered carrier and the internal frequency reference of the receiver. Such simplified systems are not efficient for use in conjunction with phase or quadrature modulation transmission schemes, due to the variation in the carrier phase imposed by the encoded intelligence (data). In addition, the frequency uncertainty of typical RF oscillators used in up and down conversion processes are often greater than the affordable PLL bandwidth imposed by low phase jitter requirements. One possible solution to the bandwidth problem, in accordance with the present invention, is to change the characteristics of the loop filter by, for example, switching between two such loop filters, to accommodate the divergent requirements.

A wide PLL bandwidth might be used during the initial acquisition process and then a narrow PLL bandwidth invoked once lock has been achieved. Such a system, in effect, would comprise two loop filters, and a logical switch, configured to select between the two filters once the phase error signal was determined to be sufficiently small, i.e., once lock had been achieved.

Figure 4:
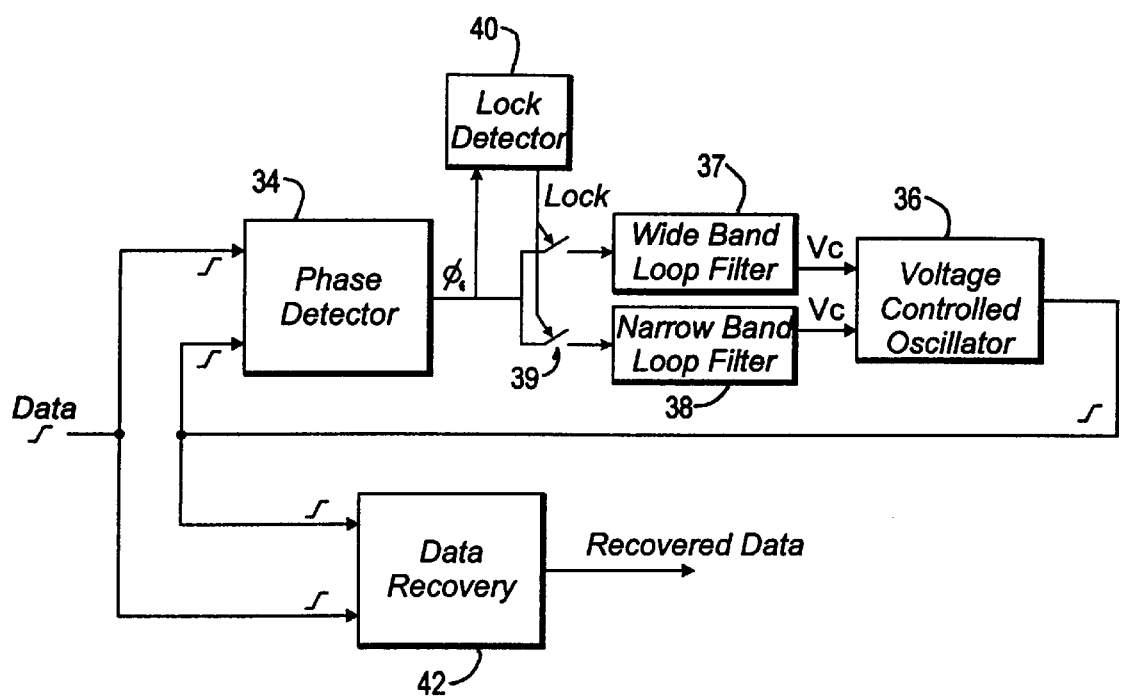
FIG. 4 is a semi-schematic simplified block diagram of a phase lock loop architecture incorporating the lock detector of FIG. 3 in accordance with the present invention.

In FIG. 4, such an exemplary PLL system is depicted, and includes certain components that are quite similar to the prior art-type PLL system depicted in connection with FIG. 1. The PLL of FIG. 4 suitably comprises a phase detector (PD) 34, configured to evaluate the phase relationship between an input signal and the output of a VCO 36. Phase error signals are directed to one or the other of two loop filters, a wideband filter 37 and a narrow band filter 38, by operation of a switch 39. Each of the loop filters 37 and 38 develops a control signal in conventional fashion suitable for advancing or retarding the frequency characteristics (and thus phase) of the VCO 36. The output of the PD 34 is also coupled in parallel fashion with the switch 39 to a lock detector 40 constructed and operating in accordance with the embodiment illustrated in connection with FIG. 3. The lock detector 40 functions to evaluate the phase error response of the PD 34 and determine the appropriate phase error conditions under which optimal phase lock occurs. Once phase lock is achieved, i.e., both the "limit 1" and "limit 2" conditions have been met, the lock detector 40 asserts a "lock" signal to a decision engine 42 such as switch control logic, or directly to the switch. In response, the system switches the PD output from the wideband filter to the narrow band filter, adaptively reconfiguring the PLL bandwidth as a consequence. The PLL output is now optimally configured for data recovery operations such as coherent demodulation.

A novel lock detector circuit has been described that operates to optimally detect phase lock by evaluating phase error as a function two metrics; a magnitude metric and a time metric. The lock detector not only determines when a phase detector's phase error response characteristic crosses a nominal minimum error threshold, but also defines a nominal time interval within which the phase error must remain below the nominal threshold value, in order that a lock condition may be declared. The lock detector functions by recognizing that immediately after the occurrence of an input phase or frequency step, the phase error response characteristic of a PLL may actually pass through the error threshold boundaries and consequently exhibit an instantaneous phase error less than the error threshold for a brief period of time before true lock is actually achieved.

While the invention has been described in terms of particular components arranged in a particular fashion, it will be evident to one having skill in the art that the invention might likewise be suitably implemented with a different component arrangement. In particular, the "limit 1" summing amplifier and zero level comparator components may be combined into a comparator circuit that directly compares the absolute value of a phase error to a user defined "limit 1" threshold value. From the foregoing, it will be evident to those having skill in the art that the particular component descriptions and arrangements contained in the illustrated embodiments are solely for purposes of explanation and that the invention is not limited to the particular embodiments or arrangements disclosed. Nor is the invention intended to be limited to the particular applications described herein. Indeed, the novel lock detector according to the invention may be disposed in a variety of appropriate locations between a phase detector and VCO including being implemented in combination with a PLL loop filter. Nor is it particularly important that a data recovery circuit or a decision engine be coupled to the PLL in the manner depicted in the illustrated embodiments. It is sufficient that a PLL incorporate a lock detector according to the invention that is capable of asserting "lock" upon the occurrence of true phase lock, regardless of how "lock" is used by downstream processing circuitry.

Further, it will be understood by one having skill in the art that the invention is not limited to use in connection with a PLL particularly. From the foregoing description, it will be evident that the invention is suitable for use in connection with frequency lock determinations and might be incorporated in feedback-type control system circuitry of all varieties, in which the input conditions depart substantially from strict steady state.

The invention, therefore is not limited to the particular embodiments, arrangements or applications disclosed, but is intended to cover any changes, modifications or adaptations that fall within the scope and spirit of the appended claims.

What is claimed is:

1. In a phase locked loop of the type including a phase detector configured to develop phase error signals for use by at least a loop filter in deriving control signals for an oscillator circuit, a detector circuit for evaluating phase error signals in order to determine whether a lock condition has been achieved, the detector circuit comprising:

a summing circuit having at least one input for receiving input phase error signals, the summing circuit combining an input phase error signal with a first limit signal corresponding to a magnitude metric;

a comparison circuit connected to compare the summation of the phase error signal and the first limit signal to a reference signal; and a time interval counter, connected to the output of the comparison circuit and operatively responsive thereto.

2. The detector circuit of claim 1 further comprising:

a conditioning circuit disposed between the summing circuit and the phase detector, the conditioning circuit receiving phase error signals having both positive and negative phase error designations, the conditioning circuit outputting the absolute value of respective phase error signals; and wherein the summing circuit combines the absolute value of an input phase error signal with a negative valued first limit signal such that the magnitude metric represents a difference therebetween.

3. The detector according to claim 2, wherein the comparison circuit compares the magnitude metric to a zero reference signal, the comparison circuit asserting a signal having a first state if the magnitude metric is less than the zero reference, the comparison circuit asserting a signal having a second state if the magnitude metric is greater than or equal to the zero reference.

4. The detector according to claim 3, wherein the time interval counter begins counting when the comparison circuit output is in the first state, the time interval counter being reset when the output of the comparison circuit is in the second state.

5. The detector according to claim 4, further comprising evaluation logic circuitry connected to the interval counter, the evaluation logic circuitry asserting a signal when the interval counter counts to a specified limit value corresponding to a time metric.

6. The detector according to claim 5, wherein the signal asserted by the evaluation logic circuitry indicates that a lock condition has been achieved.

7. In a phase locked loop of the type including a phase detector configured to develop phase error signals for use by at least a loop filter in deriving control signals for an oscillator circuit, a method for evaluating phase detector output so as to optimally determine when phase lock has been achieved the method comprising:

acquiring the absolute magnitude of each phase error signal comprising the output signal train of a phase detector;

comparing the absolute magnitude of each phase error signal with a specified phase error maximum value;

initiating a time interval count at any time the absolute magnitude of a phase error signal falls below the error limit value;

declaring a lock condition when the time count exceeds a specified time interval;

wherein the time count returns to a zero time value at any time the absolute magnitude of any phase error signal exceeds the maximum error limit value;

wherein the comparison step further comprises:
  arithmetically summing the absolute magnitude of each phase error signal with a negative valued first limit signal; and
  comparing the summation to a reference signal.

8. The method according to claim 7, wherein the time count is performed by an interval timer circuit.

9. The method according to claim 8, wherein the reference signal is a zero reference, the interval timer circuit counting when the summation comparison is less than the zero reference.

10. The method according to claim 9, further comprising the step of filtering the output signal train of a phase detector through a low pass filter prior to acquiring the absolute magnitude of each phase error signal.

* * * * *